(12) United States Patent
Ishizuya

(10) Patent No.: US 8,916,856 B2
(45) Date of Patent: Dec. 23, 2014

(54) DISPLAY APPARATUS

(71) Applicant: Canon Kabushiki Kaisha, Tokyo (JP)

(72) Inventor: Koji Ishizuya, Chiba (JP)

(73) Assignee: Canon Kabushiki Kashia, Tokyo (JP)

( * ) Notice: Subject to any disclaimer, the term of this patent is extended or adjusted under 35 U.S.C. 154(b) by 80 days.

(21) Appl. No.: 13/663,794

(22) Filed: Oct. 30, 2012

(65) Prior Publication Data

US 2013/0105776 A1 May 2, 2013

(30) Foreign Application Priority Data

Oct. 31, 2011 (JP) .................................. 2011-238945

(51) Int. Cl.

| H01L 29/08 | (2006.01) |
|---|---|
| H01L 51/50 | (2006.01) |
| H01L 27/32 | (2006.01) |
| H01L 33/00 | (2010.01) |
| H01L 51/52 | (2006.01) |
| H01L 51/00 | (2006.01) |

(52) U.S. Cl.
CPC ....... *H01L 51/5064* (2013.01); *H01L 2251/558* (2013.01); *H01L 51/5218* (2013.01); *H01L 51/006* (2013.01); *H01L 51/5265* (2013.01); *H01L 27/3211* (2013.01)
USPC .................... 257/40; 257/59; 257/72; 257/79; 257/88; 257/E51.018

(58) Field of Classification Search
CPC . H01L 33/32; H01L 51/0546; H01L 27/1214; H01L 25/167; H01L 25/0753; H01L 33/08; H01L 27/14643
USPC ............. 257/12, 14, 59, 79, 80, 82, 414, 431, 257/432, E51.001, E51.002, E51.018, 257/E51.019, E51.022, E51.026, E33.001, 257/E33.012, E33.061, E33.062, E33.072, 257/E25.001, E25.008, E25.019, E25.028, 257/E25.02, E25.026, 40, 72, 88–90
See application file for complete search history.

(56) References Cited

U.S. PATENT DOCUMENTS

| 8,053,975 B2 * | 11/2011 | Chun et al. ..................... 313/504 |
| 8,471,463 B2 * | 6/2013 | Sumida et al. ................ 313/504 |
| 2005/0058852 A1 * | 3/2005 | Tyan et al. ..................... 428/690 |
| 2008/0284324 A1 * | 11/2008 | Chun et al. ..................... 313/504 |
| 2009/0261324 A1 * | 10/2009 | Noguchi et al. ................ 257/40 |
| 2009/0261724 A1 * | 10/2009 | Noguchi et al. ............... 313/504 |
| 2012/0235131 A1 * | 9/2012 | Okamoto ........................ 257/40 |
| 2013/0038640 A1 * | 2/2013 | Kajimoto ....................... 345/690 |

FOREIGN PATENT DOCUMENTS

| JP | 2000-323277 A | 11/2000 |
| JP | 2008-288201 A | 11/2008 |

\* cited by examiner

*Primary Examiner* — Galina Yushina
(74) *Attorney, Agent, or Firm* — Canon U.S.A., Inc. IP Division

(57) ABSTRACT

A display with organic electroluminescent elements each having an optical-interference structure includes; a blue-light emitting layer containing a host material and a light emitting material, where lowest unoccupied molecular orbital of a hole-transporting layer is smaller than that of the host material and highest occupied molecular orbital (HOMO) of the host material is larger than that of the hole-transporting layer by 0.5 eV or lower; and a film-thickness adjustment layer disposed between a light emitting layer and the hole-transporting layer of a red-light emitting electroluminescent element or a green-light emitting electroluminescent element, where the hole-mobility of the adjustment layer is higher than the carrier-mobility of the light emitting layer of the electroluminescent element having the adjustment layer, and HOMO of the adjustment layer is not higher than that of the hole-transporting layer and not lower than that of the light emitting material in the light emitting layer thereof.

3 Claims, 2 Drawing Sheets

DISPLAY APPARATUS

BACKGROUND OF THE INVENTION

1. Field of the Invention

The present invention relates to a display apparatus of full color display having organic EL (electroluminescent) elements of three colors of red light emission, green light emission, and blue light emission.

2. Description of the Related Art

As a technique of increasing the luminous efficiency of the display apparatus employing the organic EL elements of three colors of red light emission (R), green light emission (G), and blue light emission (B), Japanese Patent Laid-Open No. 2000-323277 discloses a technique of varying the film thickness of functional layers other than light emitting layers of organic EL elements for each emission color. This is a technique of increasing the luminous efficiency by an optical interference structure of strengthening the peak wavelength of the emission spectrum for each emission color.

Further, Japanese Patent Laid-Open No. 2008-288201 discloses organic EL element which has achieved high efficiency and long life by providing an auxiliary layer containing materials different from those of a hole injecting layer and having hole mobility higher than that of the materials of the hole injecting layer between a light emitting layer and the hole injecting layer of each of organic EL elements of red light emission and green light emission.

However, the display apparatus disclosed in Japanese Patent Laid-Open No. 2008-288201 has a possibility such that the drive voltage becomes high depending on the constituent materials of the hole injecting layer, the light emitting layer, and the auxiliary layer.

SUMMARY OF THE INVENTION

According to an aspect of the present invention, a display apparatus reduces the drive voltage of organic EL elements of three colors of red light emission, green light emission, and blue light emission while increasing the luminous efficiency of the organic EL elements by a resonance structure.

According to another aspect of the present invention, a display apparatus has an organic EL element of red light emission, an organic EL element of green light emission, and an organic EL element of blue light emission, in which the organic EL elements each at least has an anode having a metal layer, a hole transporting layer, a light emitting layer, and a cathode, the hole transporting layer is disposed in common to the organic EL elements, the optical distance L between the light emitting position of each light emitting layer and the reflection plane of the anode is adjusted to satisfy Equation (I) in each of the organic EL elements, $$(\lambda/8) \times (-1-(2\phi/\pi)) < L < (\lambda/8) \times (1-(2\phi/\pi)) \quad (I)$$

[In Equation I, $\phi$ is the phase shift in the metal layer of the anode and $\lambda$ is the peak wavelength of the spectrum emitted from the organic EL elements of the respective colors.], the light emitting layer of the organic EL element of blue light emission contains a host material and a light emitting material, the lowest unoccupied molecular orbital (LUMO) value of the hole transporting layer is smaller than the LUMO value of the host material of the light emitting layer of the organic EL element of blue light emission, the value obtained by subtracting the highest occupied molecular orbital (HOMO) value of the hole transporting layer from the HOMO value of the host material of the light emitting layer of the organic EL element of blue light emission is 0.5 eV or lower, a film thickness adjustment layer is disposed between at least one of the light emitting layer of the organic EL element of red light emission and the light emitting layer of the organic EL element of green light emission and the hole transporting layer, the hole mobility of the film thickness adjustment layer is larger than the carrier mobility of the light emitting layer of the organic EL element in which the film thickness adjustment layer is disposed, and the HOMO value of the film thickness adjustment layer is equal to or lower than the HOMO value of the hole transporting layer and is equal to or higher than the HOMO value of a light emitting material contained in the light emitting layer of the organic EL element in which the film thickness adjustment layer is disposed.

According to another aspect of the present invention, in the display apparatus having the organic EL elements of three colors of red light emission, green light emission, and blue light emission, the drive voltage can be reduced which increasing the luminous efficiency by an optical interference structure.

Further features of the present invention will become apparent from the following description of exemplary embodiments with reference to the attached drawings.

DESCRIPTION OF THE EMBODIMENTS

Hereinafter, various embodiments of the display apparatus of the present invention are described with reference to the drawings. To portions which are not illustrated or described in this specification, well known or known techniques in the technical field are applied. The present invention is not limited to the embodiments described below. The value of the lowest unoccupied molecular orbital (LUMO) and the value of the highest occupied molecular orbital (HOMO) about layers constituting the organic EL elements described in the present invention are indicated by the absolute value based on the vacuum level.

Figure 1:
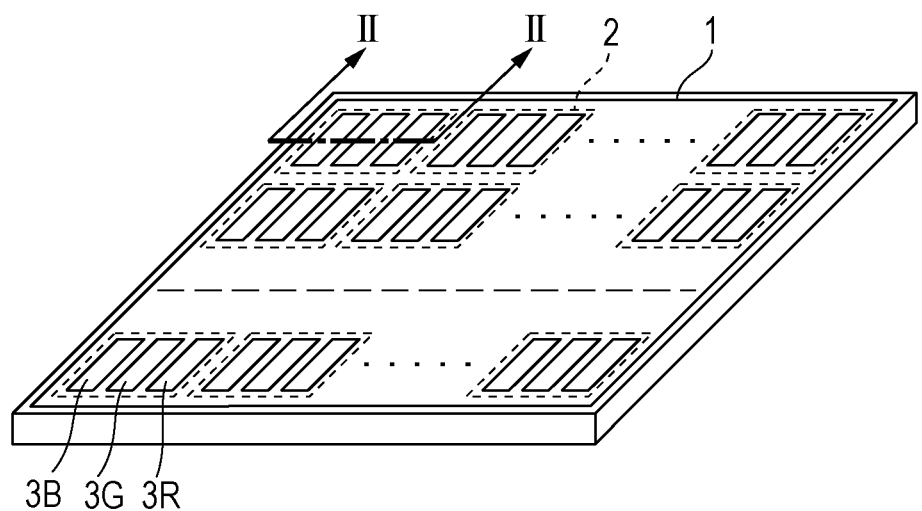
FIG. 1 is a perspective view of a display apparatus of an embodiment of the present invention.

FIG. 1 is a perspective view schematically illustrating the configuration of one embodiment of the display apparatus of the present invention. FIG. 1 includes a display region 1, a pixel 2, and organic EL elements 3R, 3G, and 3B. The display apparatus of the present invention has a plurality of the pixels 2, and the pixel 2 contains one set of the organic EL elements 3R, 3G, and 3B which emit red light, green light, and blue light, respectively. In the display apparatus, a plurality of the pixels 2 are disposed in the shape of a matrix.

Figure 2:
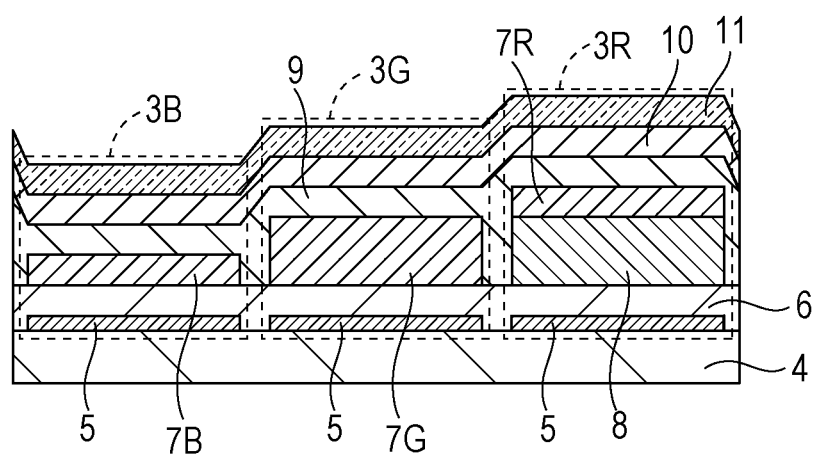
FIG. 2 is a cross sectional view of the outline of one pixel of the display apparatus of an embodiment of the present invention.

FIG. 2 is a cross sectional view of the outline of the pixel 2 along the II-II line of FIG. 1. The pixel 2 has an organic EL element 3R of red light emission, an organic EL element 3G of green light emission, and an organic EL element 3B of blue light emission. Each organic EL element has a hole transporting layer 6, a light emitting layer (any one of 7R, 7G, and 7B), and a cathode 11 in order from an anode 5, and the hole transporting layer 6 is disposed in common to each organic EL element. A substrate 4 is formed with glass, plastic, silicon, or the like. On the substrate, a switching element (not illustrated), such as TFT, may be formed.

On the substrate 4, the anode 5 containing a metal layer is formed. The anode is formed for reflecting light emitted from the light emitting layer of the organic EL element to form an optical interference structure to thereby increase the luminous efficiency. The anode 5 is patterned in such a manner as to correspond to each of the red, green, and blue organic EL elements. The metal layer of the anode is suitably formed with metal having high reflectivity or an alloy thereof and particularly materials, such as Al, Ag, Pt, Au, Cu, Pd, Ni, and Mo are suitable. The anode 5 may be a laminate in which a transparent conductive material having high work function, such as ITO and IZO, is laminated on the metal layer. An insulating film (not illustrated) may be further formed at the edge of the anode 5 corresponding to each of the red, green, and blue organic EL elements 3R, 3G, and 3B.

On the anode 5 of each of the organic EL elements 3R, 3G, and 3B of red light emission, green light emission, and blue light emission, respectively, the hole transporting layer 6 containing a hole transporting material is formed in common. Between the anode 5 and the hole transporting layer 6, a hole injecting layer or the like may be formed in common to each of the organic EL elements 3R, 3G, and 3B.

The blue light emitting layer 7B is formed in a region corresponding to the anode 5 of the blue organic EL element on the hole transporting layer 6 in such a manner as to contact the hole transporting layer 6. The blue light emitting layer 7B is formed with at least a host material and a light emitting material.

The LUMO value of the hole transporting layer 6 is smaller than the LUMO value of the host material of the blue light emitting layer 7B. By forming such a configuration, electrons in the blue light emitting layer 7B are prevented from flowing into the hole transporting layer 6 and the recombination rate in the blue light emitting layer 7B increases, so that the luminous efficiency of the blue organic EL element 3B can be increased.

Figure 3:
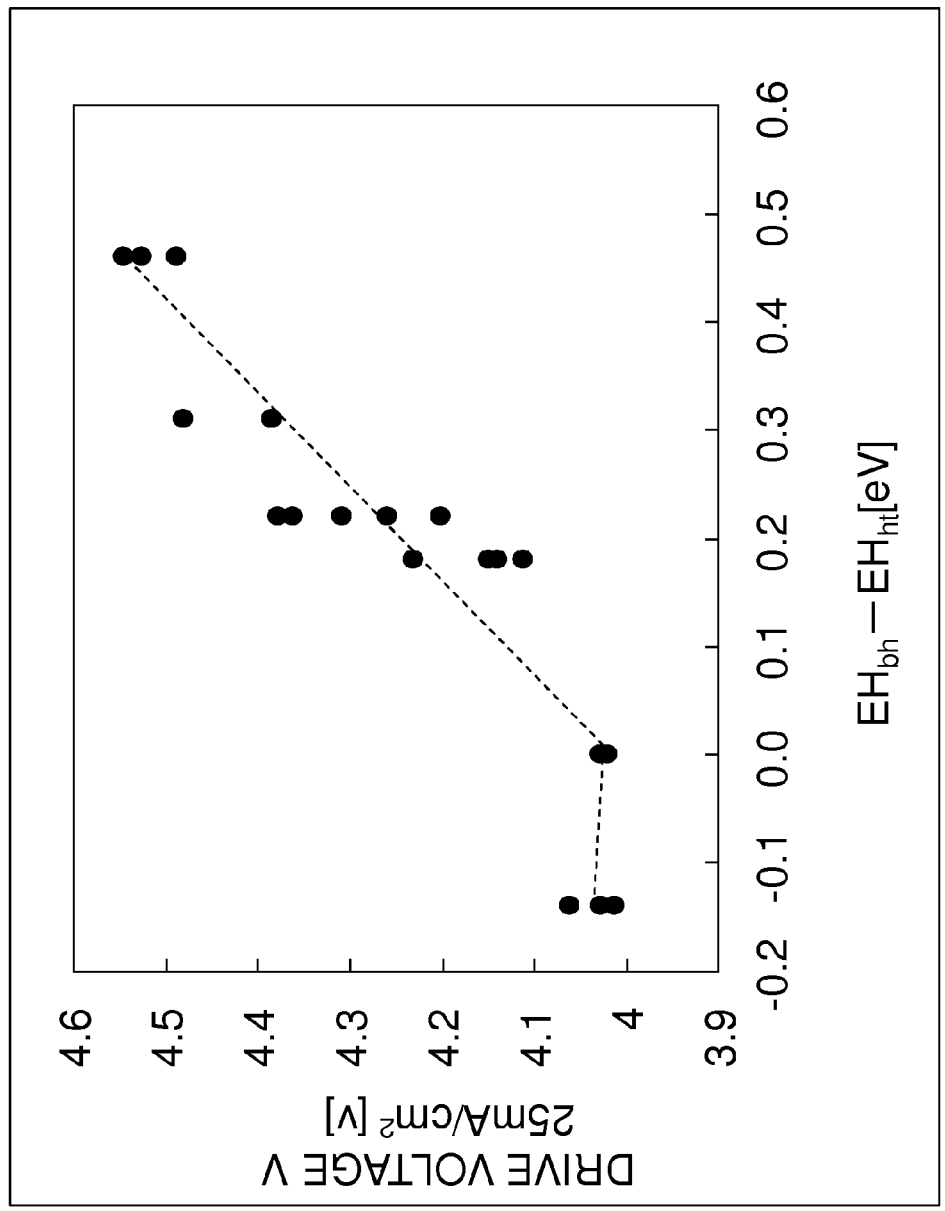
FIG. 3 is a view illustrating the relationship between the value $EH_{bh}$-$EH_{ht}$ obtained by subtracting the HOMO value of a hole transporting layer from the HOMO value of a host material of a blue light emitting layer of a blue organic EL element and the drive voltage.

The value $EH_{bh}$-$EH_{ht}$ obtained by subtracting the HOMO value ($EH_{ht}$) of the hole transporting layer 6 from the HOMO value ($EH_{bh}$) of the host material of the blue light emitting layer 7B of the organic EL element 3B of blue light emission is 0.5 eV or lower. FIG. 3 illustrates the relationship of the value $EH_{bh}$-$EH_{ht}$ obtained by subtracting the HOMO value of the hole transporting layer 6 from the HOMO value of the host material of the blue light emitting layer 7B and the drive voltage of the organic EL element 3B of blue light emission when changing the materials of the hole transporting layer 6. FIG. 3 shows that when $EH_{bh}$-$EH_{ht}$ is 0 eV or lower, there is no difference in the drive voltage, but, with an increase in $EH_{bh}$-$EH_{ht}$ from 0 eV, the drive voltage becomes larger. The increase in $EH_{bh}$-$EH_{ht}$ means an increase in an injection barrier for holes at the interface between the hole transporting layer 6 and the blue light emitting layer 7B. An increase in the injection barrier at the interface increases the drive voltage of the organic EL elements. The increase in the drive voltage is suitably as small as possible but is suitably 0.5 V or lower as the minimum value. Therefore, from FIG. 3, $EH_{bh}$-$EH_{ht}$ is suitably 0.5 eV or lower.

The optical distance L between the light emitting position and the reflection plane in the optical interference structure is represented by the following equation A. In Equation A, m is an integer of 0 or more.

$$L=(\lambda/4)\times(2m-(\phi/\pi)) \tag{A}$$

$\phi$: Phase shift in the metal layer of the anode
$\lambda$: Peak wavelength of the spectrum emitted from the organic EL elements of the respective colors The optical distance L from the light emitting position of the blue light emitting layer 7B to the reflection plane of the anode 5 is adjusted to establish m=0 from Equation (A). Considering the viewing angle characteristics and the like in the trade-off relationship with the luminous efficiency at the front, it is not always necessary to be strictly in agreement with the film thickness in an actual organic EL element. Specifically, there may be an error within $\pm\lambda/8$ from the value in which the optical distance L satisfies Equation A. Beneficially, in accordance with the present invention, in the organic EL element, the optical distance L can be adjusted in such a manner as to satisfy Equation I. Due to the fact the optical distance L satisfies Equation I, the luminous efficiency of the organic EL element 3B of blue light emission can be increased by the optical interference structure. The adjustment of the optical distance L is achieved by changing the film thickness of the hole transporting layer 6 or the film thickness of the blue light emitting layer 7B.

$$(\lambda/8)\times(-1-(2\phi/\pi))<L<(\lambda/8)\times(1-(2\phi/\pi)) \tag{I}$$

More suitably, an error of the optical distance L is within $\pm\lambda/16$ from the value with which the optical distance L satisfies Equation A. Beneficially, in accordance with the present invention, in the organic EL element, the optical distance L can be adjusted in such a manner as to satisfy the following equation II.

$$(\lambda/16)\times(-1-(4\phi/\pi))\leq L\leq(\lambda/16)\times(1-(4\phi/\pi)) \tag{II}$$

In addition, since $\phi$ is about $-\pi$, the organic EL element can satisfy the following relationships (I') or (II').

$$\lambda/8<L<3\lambda/8 \tag{I'}$$

$$3\lambda/16<L<5\lambda/16 \tag{II'}$$

A film thickness adjustment layer 8 is disposed between at least one of the light emitting layer 7R of the organic EL element 3R of red light emission and the light emitting layer 7G of the green organic EL element 3G and the hole transporting layer 6. The film thickness adjustment layer 8 is formed in a region corresponding to the anode 5 and/or the anodes 5 of the organic EL element 3R of red light emission and/or the organic EL element 3G of green light emission. In the organic EL element in which the film thickness adjustment layer 8 is provided among the organic EL element 3R of red light emission and the organic EL element 3G of green light emission, a light emitting layer containing at least a light emitting material is formed on the film thickness adjustment layer 8. FIG. 1 illustrates the configuration such that the film thickness adjustment layer 8 is disposed only in the organic EL element 3R of red light emission.

The optical distance L from the light emitting position(s) of the light emitting layer 7R of the organic EL element 3R of red light emission and/or the light emitting layer 7G of the organic EL element 3G of green light emission in which the film thickness adjustment layer 8 is provided to the reflection plane of the anode 5 is also adjusted in such a manner as to satisfy Equation I, II, I' or II' above similarly as the organic EL element 3B of blue light emission. Due to the fact the optical distance L satisfies Equation I, II, I' or II', the luminous efficiency of the organic EL element 3R of red light emission and the organic EL element 3G of green light emission can be increased by the optical interference structure. In the organic EL element provided with the film thickness adjustment layer

8, the adjustment of the optical distance L is achieved by changing the film thickness of the film thickness adjustment layer 8.

The film thickness adjustment layer 8 is formed with a material having hole mobility higher than that of the hole transporting layer 6 and the carrier mobility of the light emitting layer of the organic EL element provided with the film thickness adjustment layer 8. Thus, by adjusting the optical distance L by the film thickness adjustment layer 8 formed with a material having high hole mobility, the drive voltage of the organic EL element can be further reduced rather than by adjusting the optical distance L by the hole transporting layer 6 or the light emitting layer.

The HOMO value of the film thickness adjustment layer 8 is equal to or lower than the HOMO value of the hole transporting layer 6 and is equal to or higher than the HOMO value of the light emitting material contained in the light emitting layer on the film thickness adjustment layer 8. By forming such an element configuration, an injection barrier of holes disappears at two interfaces of the interface between the hole transporting layer 6 and the film thickness adjustment layer 8 and the interface between the film thickness adjustment layer 8 and the light emitting layer. Therefore, due to the disappearance of the injection barrier of holes at the interface between the layers, an increase in the drive voltage can be prevented.

Since the peak wavelength of the spectrum of the organic EL element 3R of red light emission is large, a required optical distance L becomes large. Since the required film thickness increases with an increase in the optical distance L, the effect of the film thickness adjustment layer 8 having high hole mobility becomes large. Therefore, it is more suitable that the film thickness adjustment layer 8 is formed at least in the organic EL element 3R of red light emission.

The film thickness adjustment layer 8 can be constituted with a material having higher hole mobility. It is particularly suitable that the film thickness adjustment layer 8 is constituted with a material containing two or more tri-aryl-amine structures having high hole mobility.

In the organic EL element which is not provided with the film thickness adjustment layer 8 among the organic EL element 3R of red light emission and the organic EL element 3G of green light emission, a light emitting layer at least containing a light emitting material is formed in a region corresponding to the anode of the organic EL element, which is not provided with the film thickness adjustment layer 8, on the hole transporting layer 6. The optical distance L from the light emitting position of the light emitting layer to the reflection plane of the anode 5 is also adjusted in such a manner as to satisfy Equation I similarly as in the organic EL element of blue light emission. Due to the fact the optical distance L satisfies Equation I, the luminous efficiency can be increased by the optical interference structure in the organic EL element which is not provided with the film thickness adjustment layer 8. The adjustment of the optical distance L is achieved by changing the film thickness of the light emitting layer.

The cathode 11 is provided above the light emitting layers 7R, 7G, and 7B of the respective colors, and a transparent conductive material or a translucent metal thin film can be used. For the transparent conductive material, ITO, IZO, and the like can be used and as the translucent metal thin film, the same metal as that of the anode 5 is used. In the case of the film thickness in which the absorption is 50% or lower, it can be used irrespective of the ratio of penetration and reflection.

Between each of the light emitting layers 7R, 7G, and 7B and the cathode 11, functional layers, such as a hole blocking layer (not illustrated), an electron transporting layer 9, an electron injection layer 10, and the like may be provided.

These functional layers may be common to the organic EL elements of red light emission, green light emission, and blue light emission and the film thickness of the functional layer may be different or the materials forming the functional layers may be different for each emission color. For the functional layers, known organic EL materials can be used.

It is suitable for the light emitting layer of the organic EL element provided with the film thickness adjustment layer 8 among the organic EL element 3R of red light emission and the organic EL element 3G of green light emission to contain materials forming the film thickness adjustment layer 8. The hole mobility of the film thickness adjustment layer 8 is higher than the carrier mobility of the light emitting layer. Therefore, by compounding the material forming the film thickness adjustment layer 8 in the light emitting layer 7, the drive voltage can be further reduced.

It is suitable for the light emitting layer of the organic EL element provided with the film thickness adjustment layer 8 among the organic EL element 3R of red light emission and the organic EL element 3G of green light emission to contain a phosphorescent light emitting material.

When comparing the light emission process of a fluorescent light emitting material and a phosphorescent light emitting material, the fluorescent light emitting material emits light from an excitation singlet state S1 and the phosphorescent light emitting material emits light from an excitation triplet state T1. S1 has an energy level higher than that of T1. The drive voltage for the light emitting material to emit light is determined by S1. Therefore, there is a problem in that when a fluorescent light emitting material and a phosphorescent light emitting material emit light having the same wavelength, the drive voltage of the phosphorescent light emitting material having S1 higher than that of the fluorescent light emitting material, becomes high.

Therefore, the configuration of the display apparatus can reduce the drive voltage of the organic EL element 3R of red light emission or the organic EL element 3G of green light emission containing a phosphorescent light emitting material in the light emitting layer.

Typical structural formulae of materials used as the film thickness adjustment layer 8, a light emitting layer host, and a light emitting dopant are shown below. However, the present invention is not limited thereto.

As the materials of the film thickness adjustment layer 8, materials of the following structural formulae are mentioned as an example.

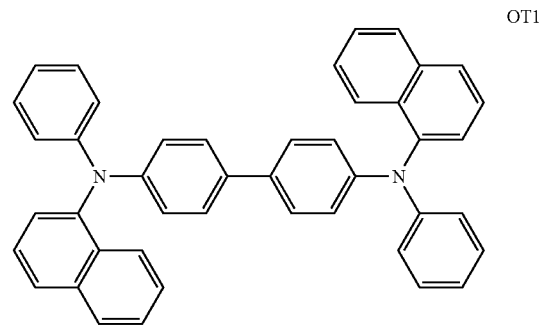

OT1

OT2
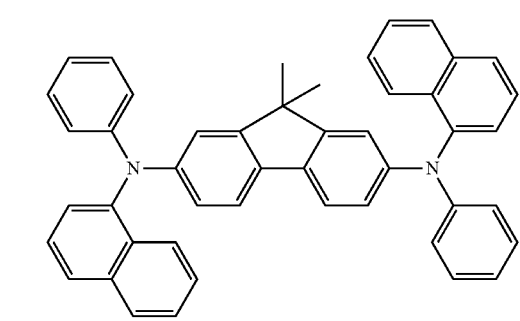
OT3
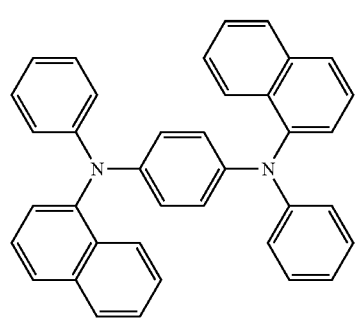
OT4
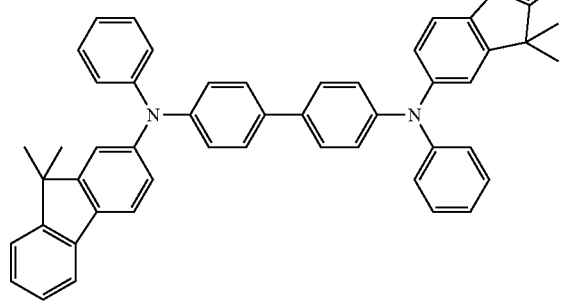
OT5
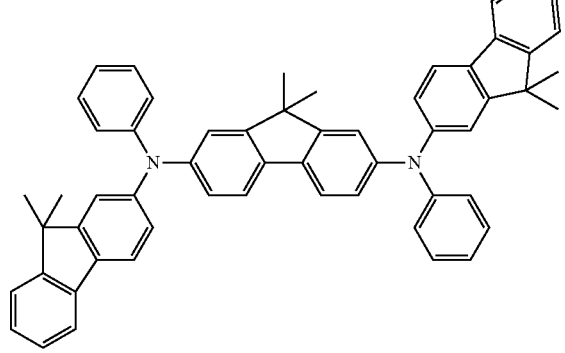
OT6
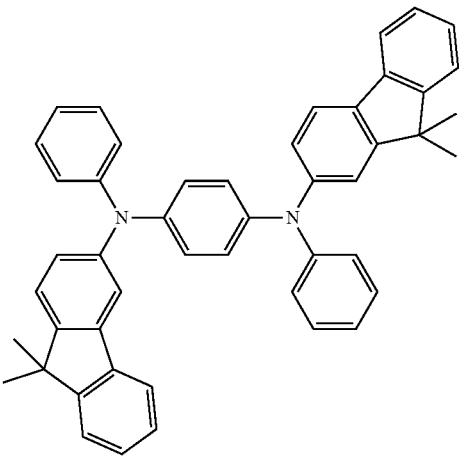
OT7
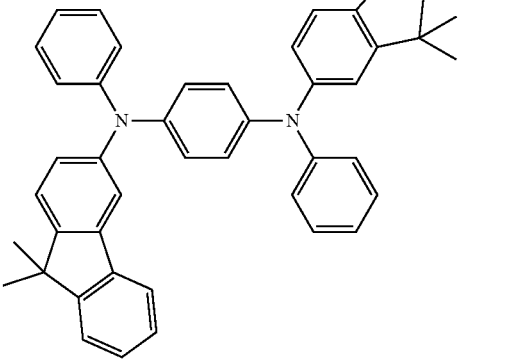
OT8
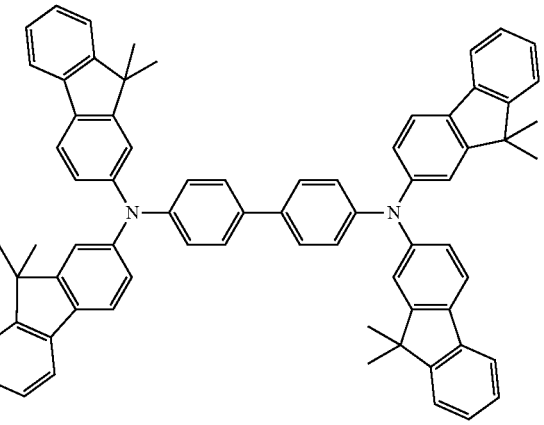

OT9
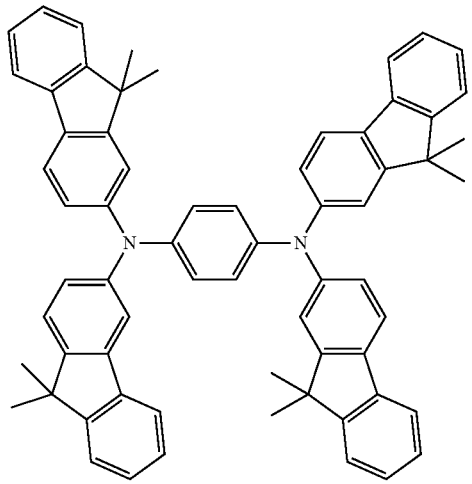
OT10
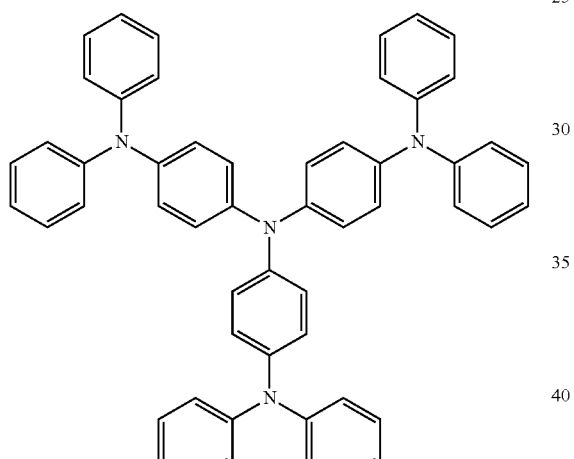
OT11
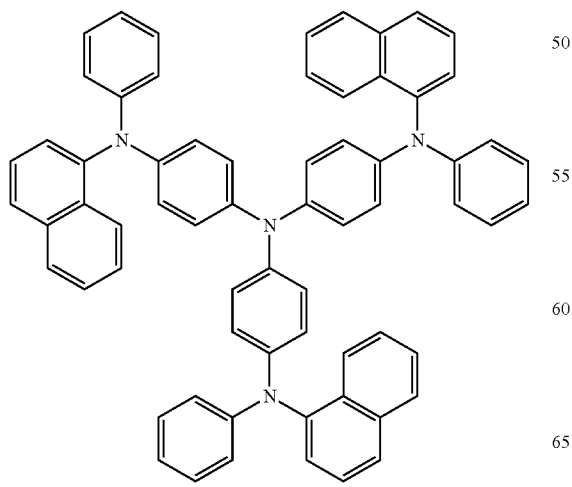
OT12
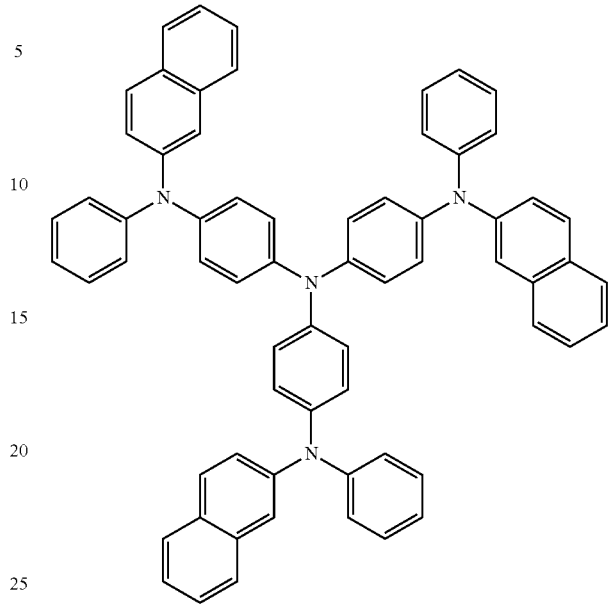
OT13
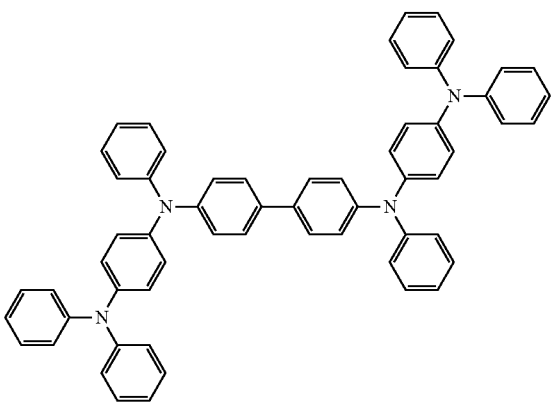
OT14
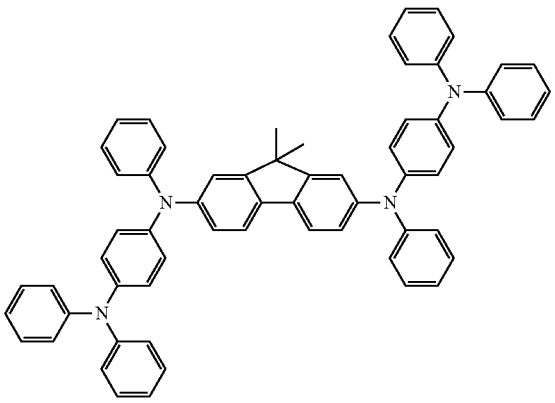

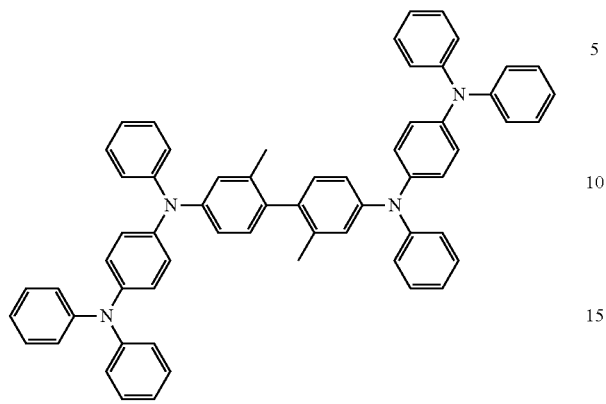
OT15
As the host material of the red light emitting layer 7R, materials of the following structural formulae are mentioned as an example.
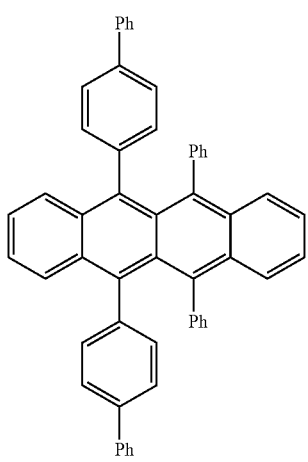
RH1
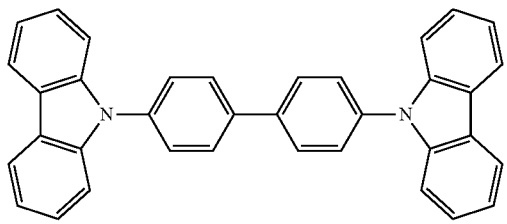
RH2
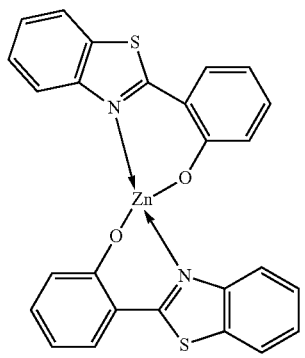
RH3

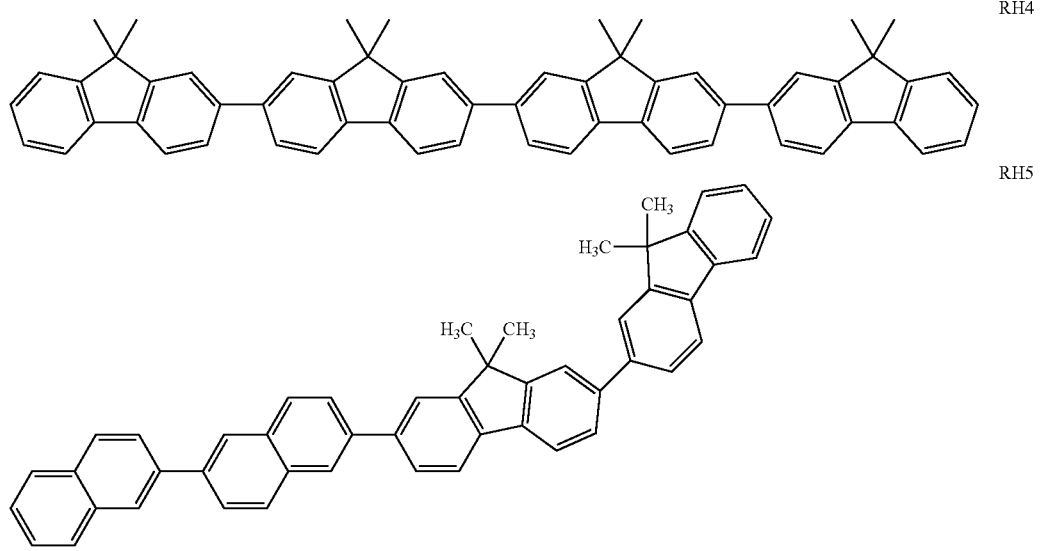
RH4
RH5
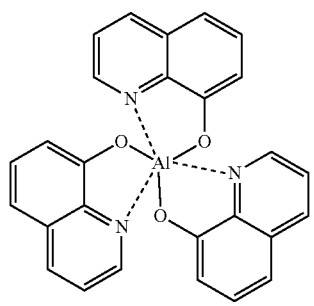
RH6
As the light emitting dopant material of the red light emitting layer 7R, materials of the following structural formulae are mentioned as an example.
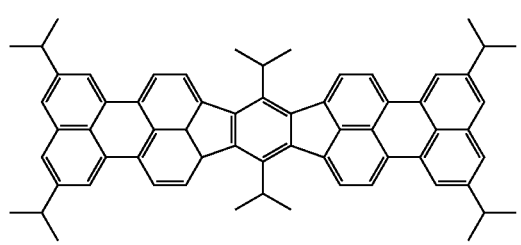
RD1
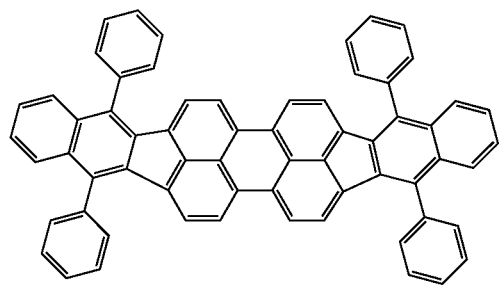
RD2
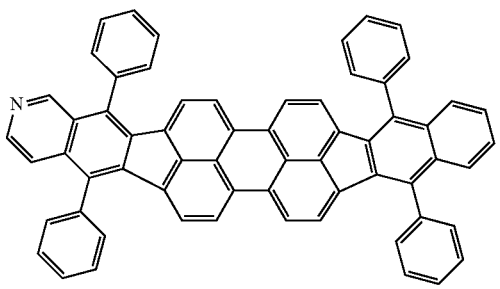
RD3

-continued
RD4
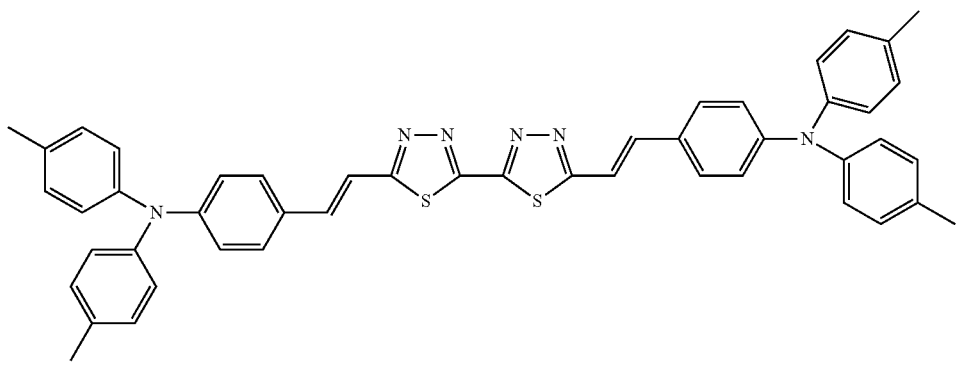
RD5
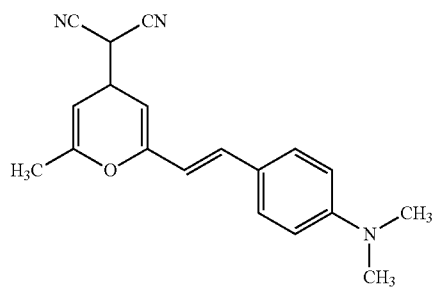
RD6
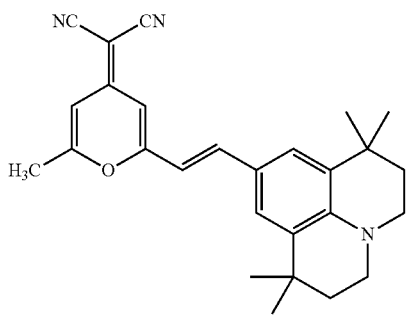
RD7
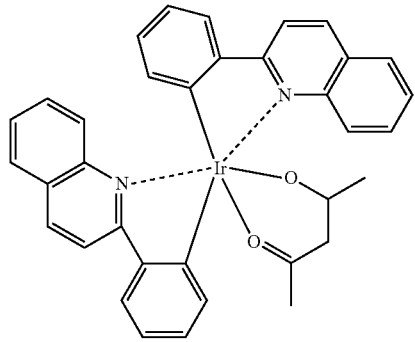
RD8
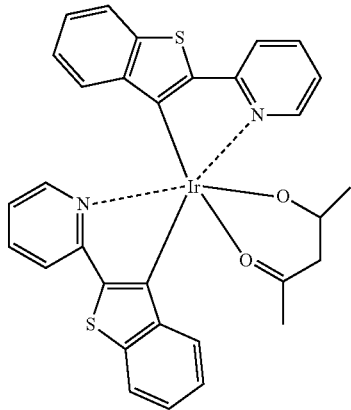
RD9
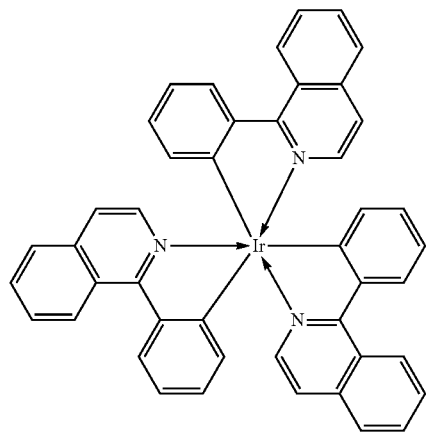
RD10
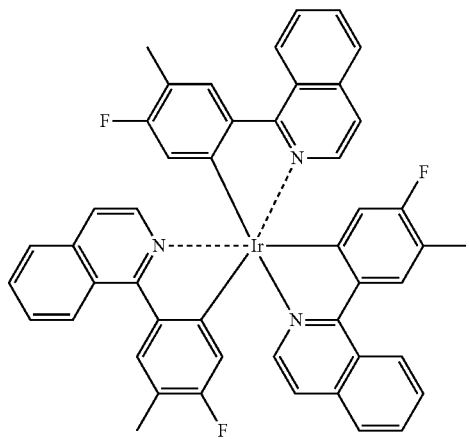

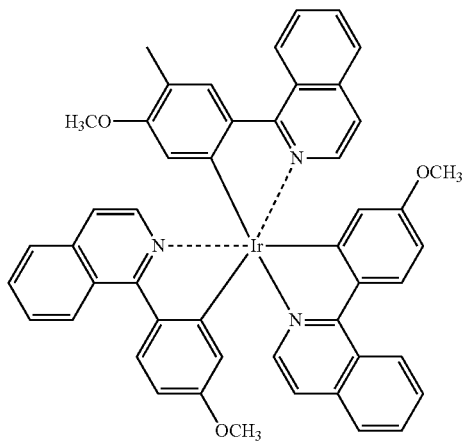
RD11
As the host material of the green light emitting layer 7G, materials of the following structural formulae are mentioned as an example.
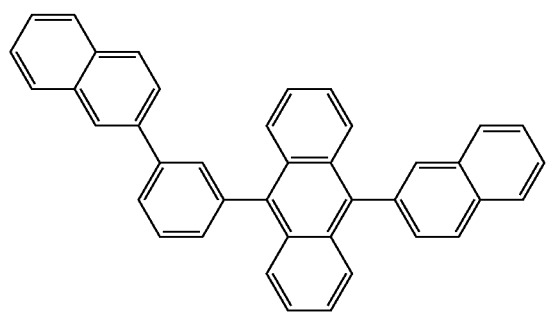
GH1
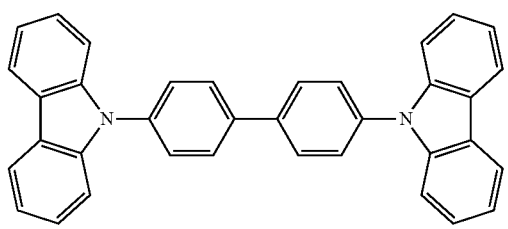
GH4
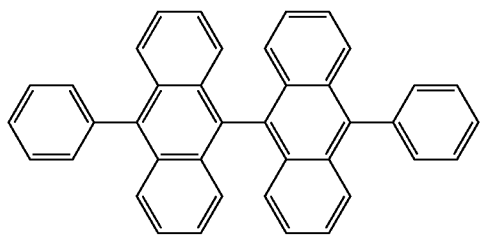
GH2
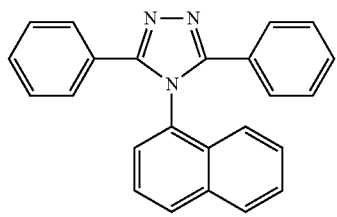
GH5
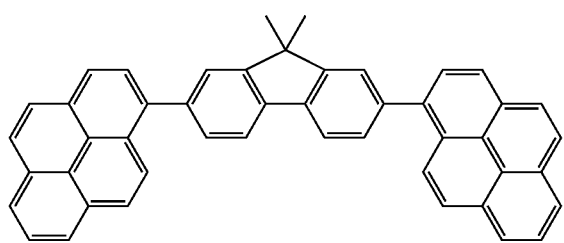
GH3
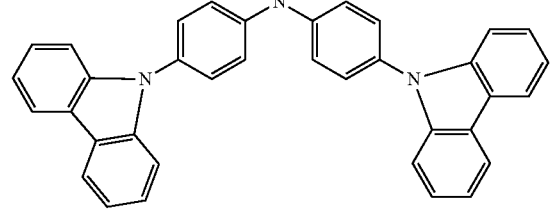
GH6

GH7
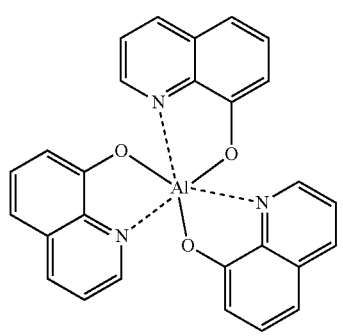
GD4
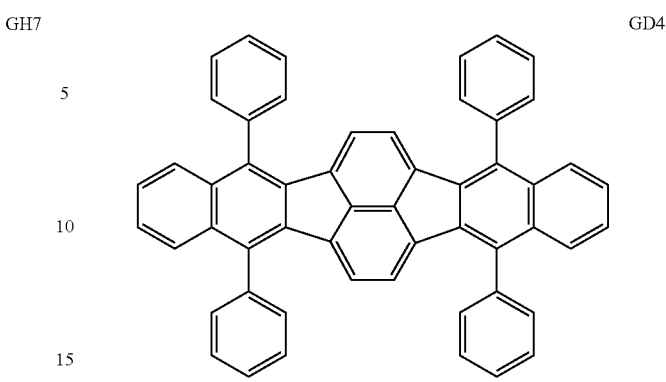
As the light emitting dopant material of the green light emitting layer 7G, materials of the following structural formulae are mentioned as an example.
GD1
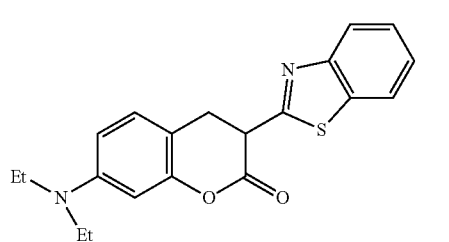
GD5
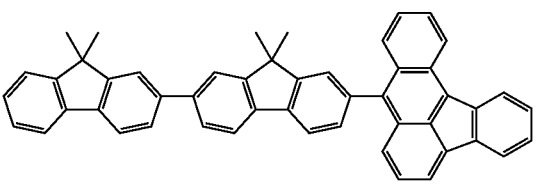
GD2
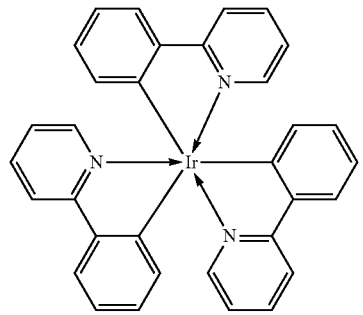
GD6
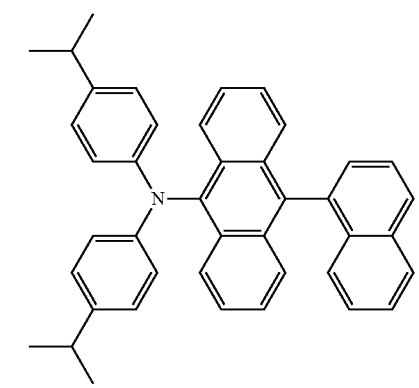
GD3
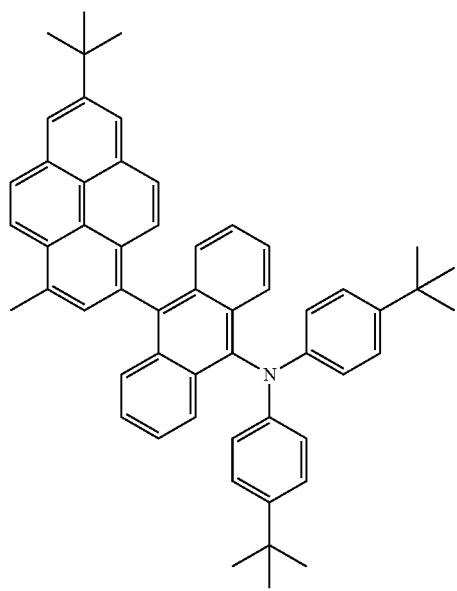
GD7
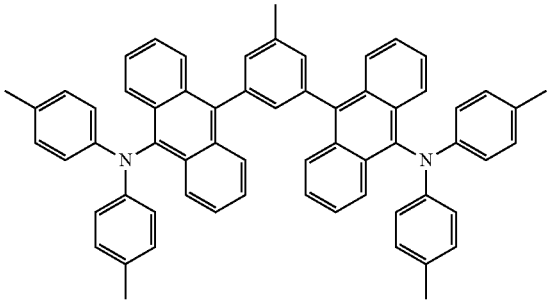

GD8
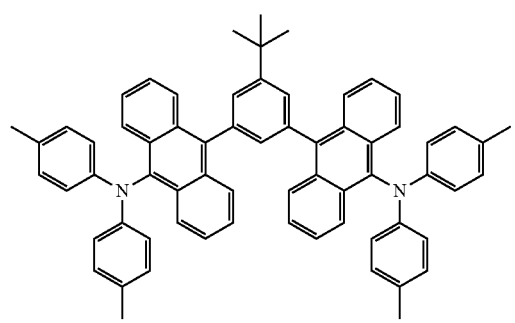
GD10
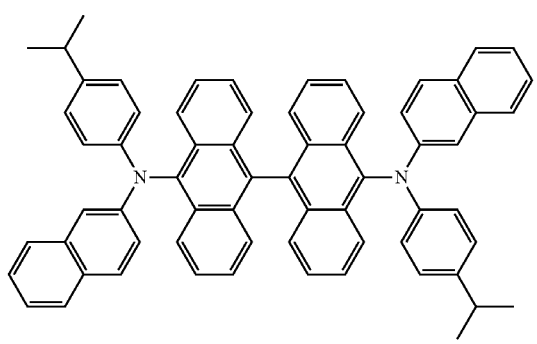
GD9
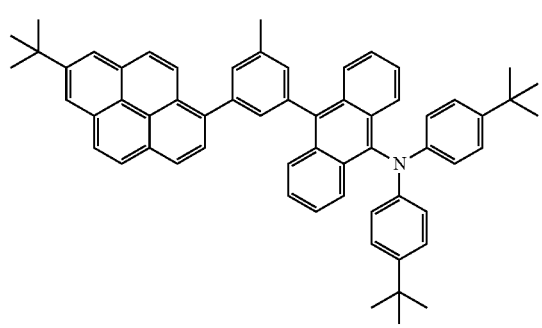
As the host material of the blue light emitting layer 7B, materials of the following structural formulae are mentioned as an example.
BH1
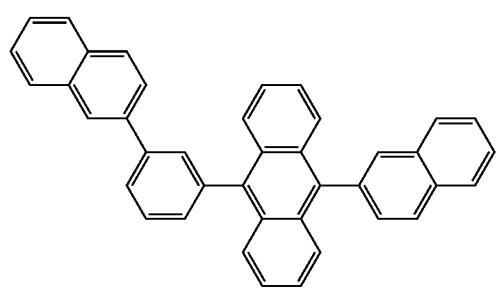
BH2
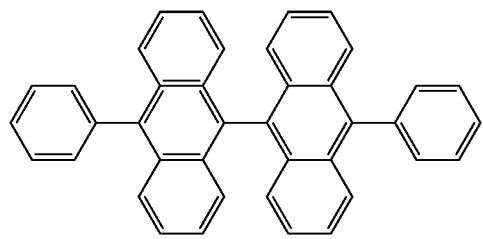
BH3
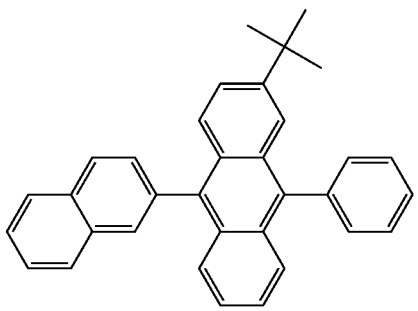
BH4
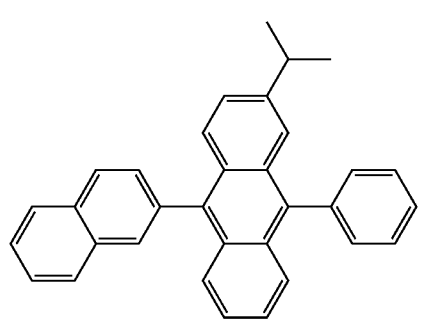
BH5
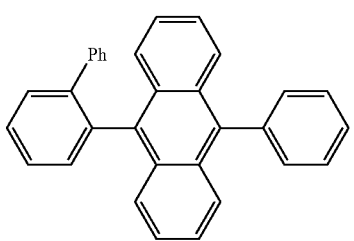

-continued
BH6
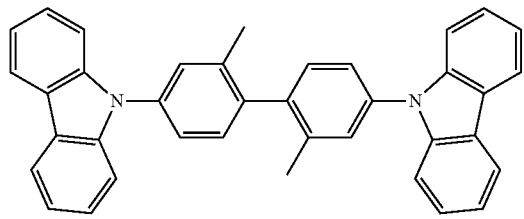
BH7
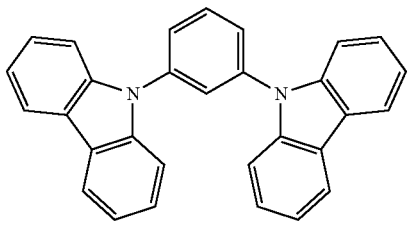
BH8
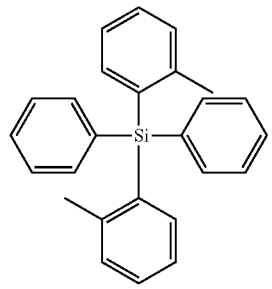
BH9
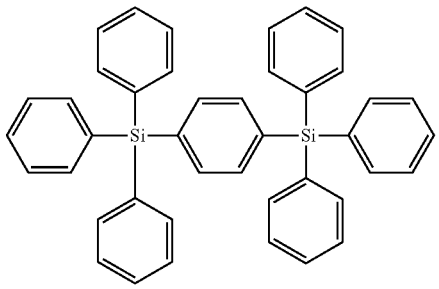
BH10
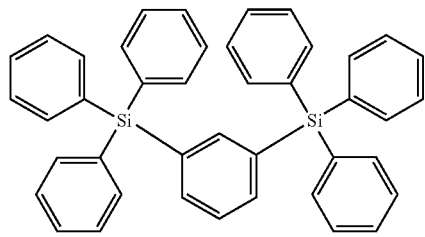
BH11
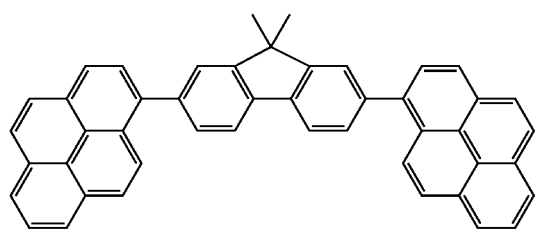
BH12
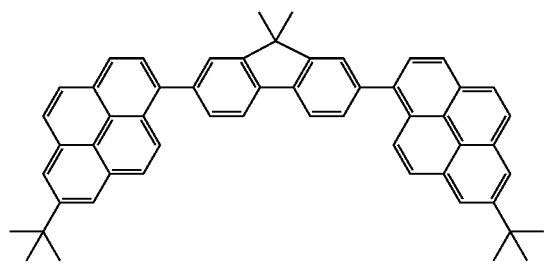
BH13
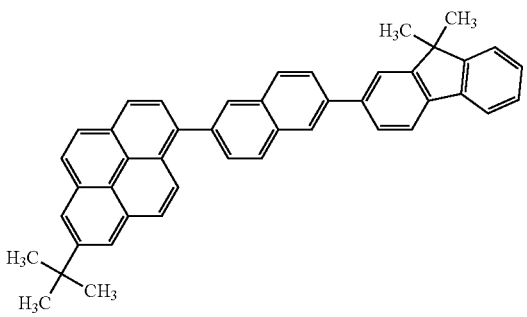
BH14
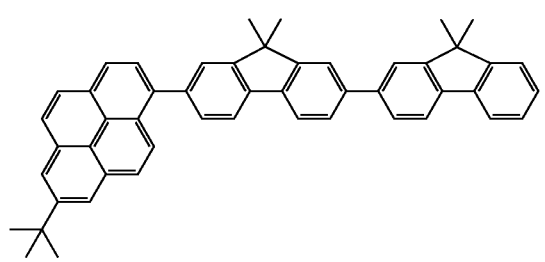

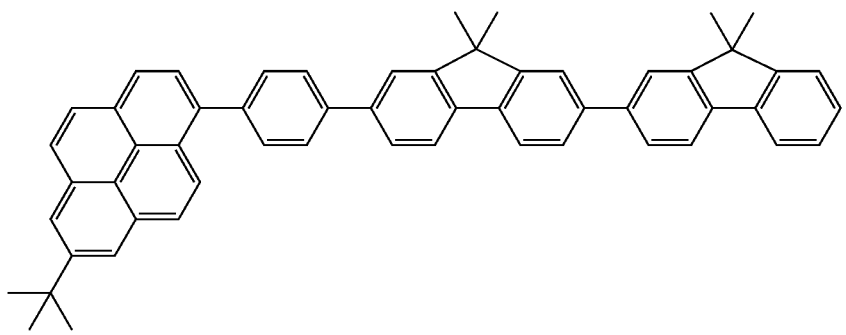
BH15
As the light emitting dopant material of the blue light emitting layer 7B, materials of the following structural formulae are mentioned as an example.
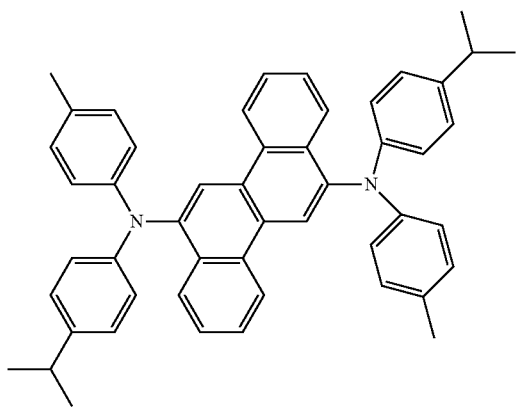
BD1
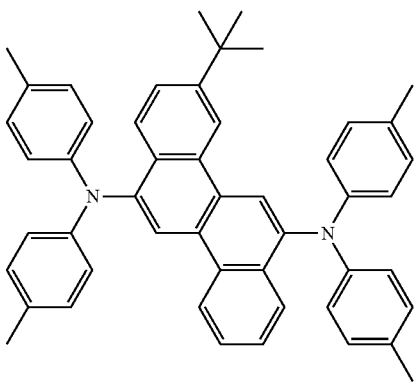
BD2
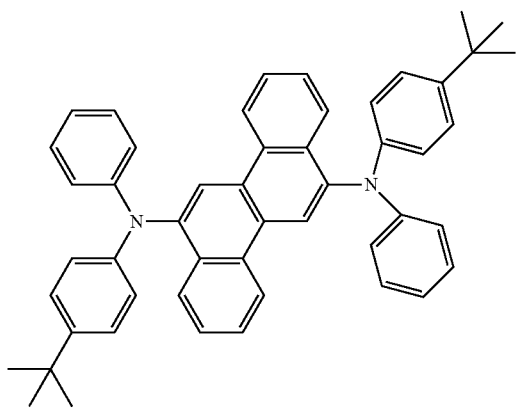
BD3
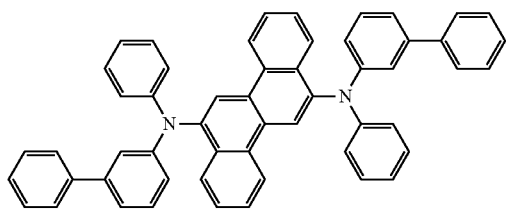
BD4

BD5
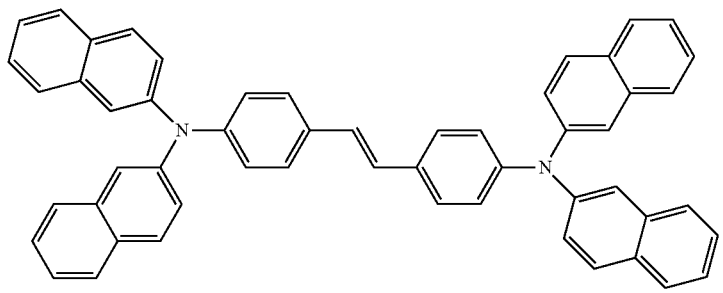
BD6
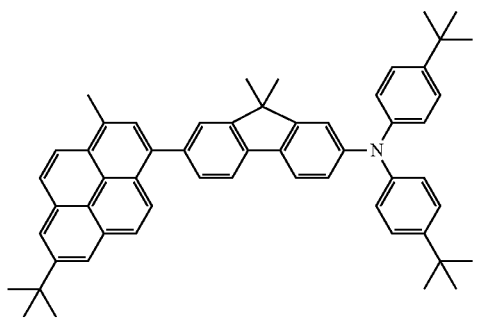
BD7
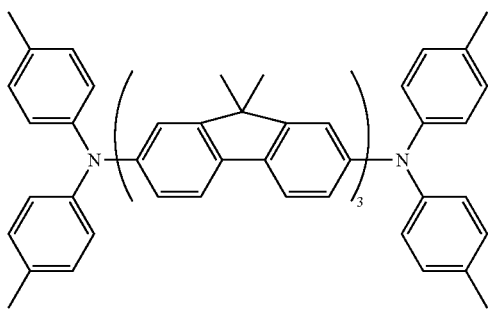
BD8
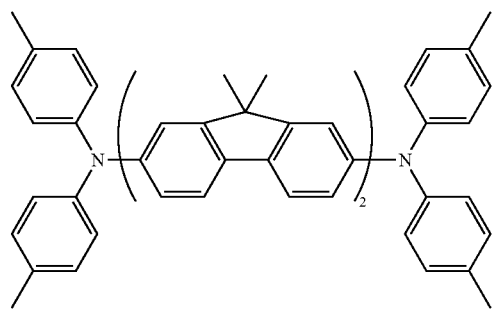
BD9
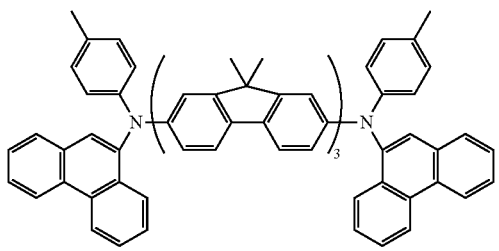
BD10
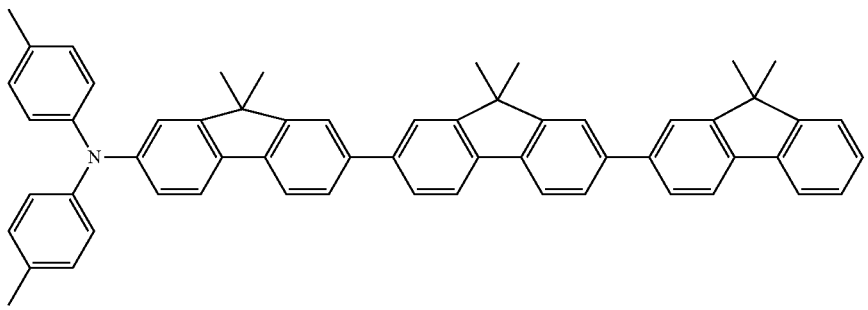

-continued
BD11
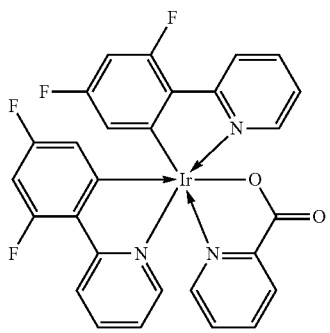
BD12
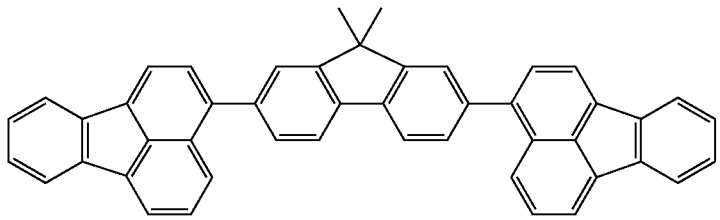
BD13
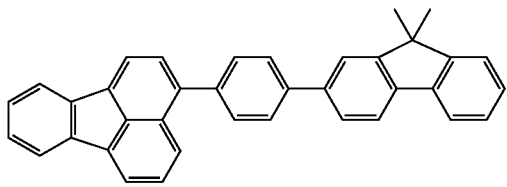
BD14
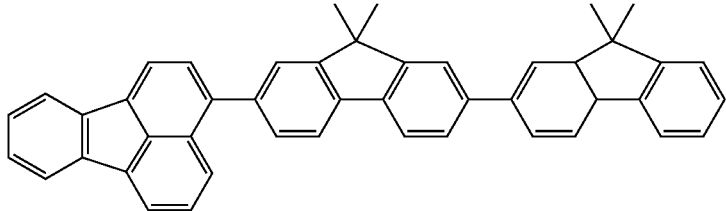
BD15
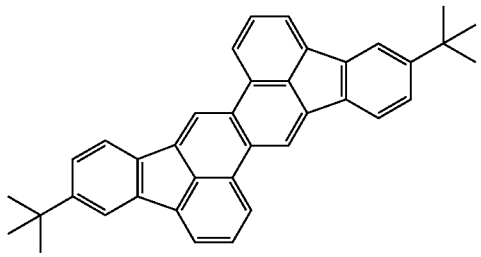
BD16
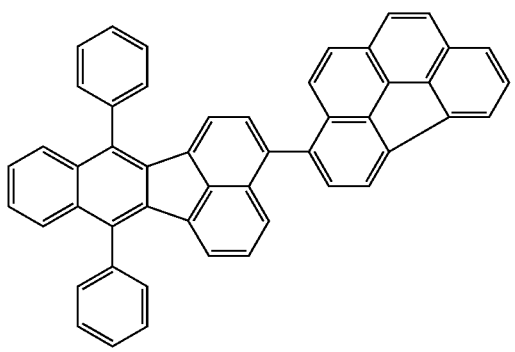
BD17
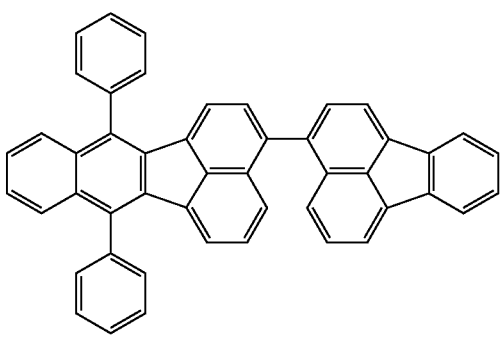

-continued

BD18

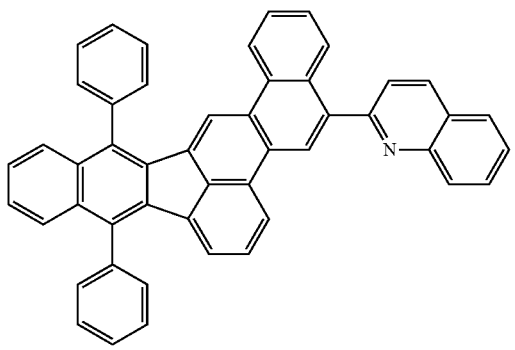

EXAMPLES

Example 1

A display apparatus of the configuration illustrated in FIG. 2 was produced. First, Al (film thickness of 100 nm)/IZO (film thickness of 10 nm) was laminated and formed into a film on the glass substrate 4, followed by patterning using photolithography, thereby forming the anode 5 of each of the color organic EL elements of the respective colors. Next, the surface of the anode 5 was washed by UV ozonization. Then, the substrate and materials were attached to a vacuum deposition device, followed by exhausting to $1 \times 10^{-4}$ Pa.

Next, a hole transporting material represented by the following structural formula was formed into a film with a film thickness of 25 nm to thereby form the hole transporting layer 6.

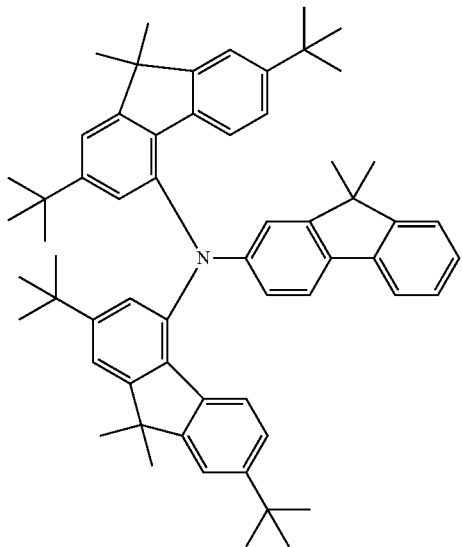 [SMILES: CC(C)(C)c1ccc2c(c1)C(C)(C)c1cc(C(C)(C)C)cc(N(c3ccc4c(c3)C(C)(C)c3ccccc3-4)c3cc(C(C)(C)C)cc4c3-c3ccc(C(C)(C)C)cc3C4(C)C)c1-2]

Next, the blue light emitting layer 7B was formed using a metal mask in a region corresponding to the anode 5 of the organic EL element 3B of blue light emission on the hole transporting layer 6. The blue light emitting layer 7B was obtained by forming a co-deposition film of the blue light emitting dopant (1 volume %) represented by the structural formula BD12 and the light emitting layer host material represented by the structural formula BH14 with a film thickness of 25 nm.

Next, the green light emitting layer 7G was formed using a metal mask on a region corresponding to the anode 5 of the organic EL element 3G of green light emission on the hole transporting layer 6. The green light emitting layer 7G was obtained by forming a co-deposition film of the green light emitting dopant (1 volume %) represented by the structural formula GD4 and the light emitting layer host material represented by the structural formula GH3 with a film thickness of 40 nm.

Next, the film thickness adjustment layer 8 was formed by forming the material represented by the structural formula OT4 into a film using a metal mask in a region corresponding to the anode 5 of the organic EL element 3R of red light emission on the hole transporting layer 6 with a film thickness of 40 nm.

Next, the red light-emitting layer 7R was formed by forming a co-deposition film of the red light emitting dopant (4 volume %) represented by the structural formula RD9 and the light-emitting layer host material represented by the structural formula RH4 with a film thickness of 25 nm without changing the position of the metal mask.

Next, the compound represented by the following structural formula ET01 was formed into a film with a film thickness of 10 nm in common to each organic EL element to thereby form the electron-transporting layer 9.

ET01

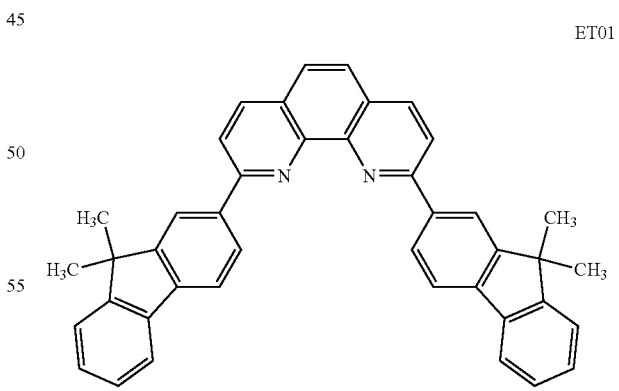

Next, a co-deposition film of cesium carbonate (3 volume %) and the compound represented by the structural formula ET01 was formed with a film thickness of 20 nm in common to each organic EL element on the electron-transporting layer 9 to thereby form the electron injection layer 10.

Subsequently, the substrate 4 on which the layers to the electron injection layer 9 were formed was transferred to a sputtering device, and then ITO was formed into a film with a film thickness of 60 nm by a sputtering method on the electron injection layer 9 to thereby form the cathode 11.

Thereafter, the substrate 4 was transferred to a glove box, and then sealed with a glass cap (not illustrated) containing a drying agent in a nitrogen atmosphere to thereby produce a display apparatus.

For evaluation of the drive voltage of the organic EL elements of the display apparatus was performed using a 4-terminal method under the conditions of a current density of 25 mA/cm$^2$. The HOMO value of each layer was measured by AC-2 of Riken Keiki Co., Ltd. As a sample, one obtained by vapor-depositing a compound by 400 Å on the glass substrate on which Al was vapor-deposited was used. The LUMO value was calculated by subtracting the energy gap from the HOMO value. The energy gap was determined from the absorption end of the ultraviolet and visible absorption spectrum obtained by the measurement using JASCO V-560 (ultraviolet and visible absorption spectrum measuring instrument). As a sample of the ultraviolet and visible absorption spectrum, one obtained by vapor-depositing a compound by 400 Å on the glass substrate.

The carrier mobility of each layer was measured by transient current measurement using a TOF (Time of Flight) method. A thin film of about 2 μm was produced by a vacuum deposition method on the glass substrate with ITO, and further aluminum was vapor-deposited as a counter electrode. The value in the electric field strength of 4×10$^5$ V/cm was measured for this sample using a TOF measuring device (TOF-301 manufactured by Optel Corporation).

Example 2

The red light emitting layer 7R was formed by forming a co-deposition film of the red light emitting dopant (4 volume %) represented by the following structural formula RD9, the material (15 volume %) represented by the following structural formula OT4, and the light emitting layer host material represented by the following structural formula RH4 with a film thickness of 25 nm. A display apparatus was produced by the same process as in Example 1 except the red light emitting layer 7R.

Comparative Example 1

A display apparatus was produced by the same process as in Example 1 except forming the material represented by the structural formula GH3 with a thickness of 40 nm as the film thickness adjustment layer 8.

Evaluation of Example 1

Table 1 shows the optical distance, λ, φ/π, the range of L given by Equation I, and the drive voltage of the red organic EL element, the green organic EL element, and the blue organic EL element of Example 1. The optical distance was calculated under the conditions such that the refractive index of the anode IZO was 2.0 and the refractive index of the hole transporting layer, the film thickness adjustment layer, and the light emitting layer was 1.8. Since the red light emitting layer has bipolarity (holes and electrons), the center of the film thickness of the light emitting layer is a light emitting position. The blue and green light emitting layers have a band structure in which the light emitting dopant traps electrons, and the light emitting position is a cathode side of each light emitting layer. The total of the optical distance of the IZO, the hole transporting layer, the film thickness adjustment layer, and the light emitting layer is the optical distance L.

λ was obtained by measuring the wavelength dispersion characteristics of the emission spectrum of each organic EL element. φ/π was determined from the phase shift φ calculated from the refractive index and the absorption coefficient of the anode. The range of the optical distance L given by Equation I was calculated from λ and φ/π.

Table 1 shows that the optical distance L of each of the red, green, and blue organic EL elements is within the range of L given by Equation I. This shows that each of the red organic EL element, the green organic EL element, and the blue organic EL element in the present invention can have an optimal structure for increasing the luminous efficiency.

The drive voltage of each of the red organic EL element, the green organic EL element, and the blue organic EL element is 3.5 V, 3.6 V, and 3.2 V, respectively, which shows that the organic EL elements of the respective colors in the present invention can sufficiently reduce the voltage.

TABLE 1

|  |  | Red organic EL element | Green organic EL element | Blue organic EL element |
| --- | --- | --- | --- | --- |
| Optical distance L | Anode IZO | 20 | 20 | 20 |
|  | Hole transporting layer | 45 | 45 | 45 |
|  | Film thickness adjustment layer | 72 | — | — |
|  | Light emitting layer | 22.5 | 72 | 45 |
|  | Total | 159.5 | 137 | 110 |
| λ |  | 623 | 517 | 452 |
| φ/π |  | −0.85 | −0.81 | −0.77 |
| Range of L given by Equation (I) |  | 54.5 to 210.3 | 40.1 to 169.3 | 30.5 to 143.5 |
| Drive voltage [V] |  | 3.5 | 3.6 | 3.2 |

Evaluation of Examples 1 and 2 and Comparative Example 1

Table 2 shows the evaluation results of the physical properties of the hole transporting layer 6, the blue light emitting layer 7B host, the film thickness adjustment layer 8, and the red light emitting layer 7R of Examples 1 and 2 and Comparative Example 1 and the evaluation results of the drive voltage of the organic EL element 3R of red light emission.

Table 2 shows that the physical properties of each layer of the hole transporting layer 6, the blue light emitting layer 7B host, the film thickness adjustment layer 8, and the red light emitting layer 7R of Examples 1 and 2 satisfy the aspects of the present invention. In contrast, Comparative Example 1 does not satisfy those aspects of the present invention because the HOMO of the film thickness adjustment layer is higher than the HOMO of the hole transporting layer and the hole mobility of the film thickness adjustment layer is lower than the hole mobility of the hole transporting layer and the carrier mobility of the red light emitting layer. The comparison in the drive voltage (25 mA/cm$^2$) of the red organic EL element of Example 1 and 2 and Comparative Example 1 shows that the drive voltage of Comparative Example 1 is 3.7 V and, in contrast thereto, the drive voltage of Example 1 is 3.5 V. Therefore, it can be said that the configuration of the display apparatus in the present invention can be highly effective for reducing the drive voltage. Table 2 shows that the drive voltage of Example 2 is 3.2 V. Therefore, it can be said that, in the configuration of the display apparatus in the present invention, the drive voltage can be further reduced by compounding the film thickness adjustment layer having hole mobility in the light emitting layer.

TABLE 2

| | | Example 1 | Example 2 | Comparative Example 1 |
|---|---|---|---|---|
| Hole transporting layer | HOMO [eV] | 5.31 | 5.31 | 5.31 |
| | LUMO [eV] | 2.06 | 2.06 | 2.06 |
| | Hole mobility [cm/Vs] | $2 \times 10^{-4}$ | $2 \times 10^{-4}$ | $2 \times 10^{-4}$ |
| Blue light emitting layer host | HOMO [eV] | 5.76 | 5.76 | 5.76 |
| | LUMO [eV] | 2.76 | 2.76 | 2.76 |
| Film thickness adjustment layer | HOMO [eV] | 5.26 | 5.26 | 5.70 |
| | Hole mobility [cm/Vs] | $1 \times 10^{-3}$ | $1 \times 10^{-3}$ | $1 \times 10^{-4}$ |
| Red light emitting layer | Light emitting material HOMO [eV] | 5.03 | 5.03 | 5.03 |
| | Hole mobility [cm/Vs] | $2 \times 10^{-4}$ | $2 \times 10^{-4}$ | $2 \times 10^{-4}$ |
| | Electron mobility [cm/Vs] | $5 \times 10^{-5}$ | $5 \times 10^{-5}$ | $5 \times 10^{-5}$ |
| | Material constituting film thickness adjustment layer | None | Contained | None |
| Drive voltage of red organic EL element [V] | | 3.5 | 3.2 | 3.7 |

While the present invention has been described with reference to exemplary embodiments, it is to be understood that the present invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-238945 filed Oct. 31, 2011, which is hereby incorporated by reference herein in its entirety.

What is claimed is:

1. A display apparatus, comprising:
an organic electroluminescent (EL) element of red light emission, an organic EL element of green light emission, and an organic EL element of blue light emission,
the organic EL elements each at least having an anode having a metal layer, a hole transporting layer, a light emitting layer, and a cathode,
the hole transporting layer disposed in common to the organic EL elements,
in each respective organic EL element, an optical distance L between a light emitting position of each light emitting layer and a reflection plane of the anode satisfies following equation, $(\lambda/8) \times (-1-(2\phi/\pi)) < L < (\lambda/8) \times (1-(2\phi/\pi))$ wherein, $\phi$ is a phase shift in the metal layer of the anode and $\lambda$ is a peak wavelength of a spectrum emitted from the respective organic EL element,
the light emitting layer of the organic EL element of blue light emission containing a host material and a light emitting material,
a lowest unoccupied molecular orbital (LUMO) value of the hole transporting layer smaller than a LUMO value of the host material of the light emitting layer of the organic EL element of blue light emission,
a value obtained by subtracting a highest occupied molecular orbital (HOMO) value of the hole transporting layer from a HOMO value of the host material of the light emitting layer of the organic EL element of blue light emission 0.5 eV or lower,
a film thickness adjustment layer disposed between at least one of the light emitting layer of the organic EL element of red light emission and the light emitting layer of the organic EL element of green light emission and the hole transporting layer,
a hole mobility of the film thickness adjustment layer higher than a carrier mobility of the light emitting layer of the organic EL element in which the film thickness adjustment layer is disposed, and
a HOMO value of the film thickness adjustment layer equal to or lower than the HOMO value of the hole transporting layer and equal to or higher than a HOMO value of a light emitting material contained in the light emitting layer of the organic EL element in which the film thickness adjustment layer is disposed.

2. The display apparatus according to claim 1, wherein the light emitting layer of the organic EL element provided with the film thickness adjustment layer among the light emitting layer of the organic EL element of red light emission and the light emitting layer of the organic EL element of green light emission contains a material forming the film thickness adjustment layer.

3. The display apparatus according to claim 1, wherein the light emitting layer of the organic EL element provided with the film thickness adjustment layer among the light emitting layer of the organic EL element of red light emission and the light emitting layer of the organic EL element of green light emission contains a phosphorescent light emitting material.

* * * * *